US012666617B2

(12) United States Patent
Zheng et al.

(10) Patent No.: US 12,666,617 B2
(45) Date of Patent: Jun. 23, 2026

(54) MICROELECTRONIC DEVICES WITH INCREASED GRAIN SIZE

(71) Applicant: Micron Technology, Inc., Boise, ID (US)

(72) Inventors: Pengyuan Zheng, Boise, ID (US); Yongjun J. Hu, Boise, ID (US); Pavan Reddy Kumar Aella, Eagle, ID (US); David Ross Economy, Boise, ID (US); Brittany L. Kohoutek, Bosie, ID (US); Amritesh Rai, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 358 days.

(21) Appl. No.: 18/307,698

(22) Filed: Apr. 26, 2023

(65) Prior Publication Data

US 2023/0397423 A1 Dec. 7, 2023

Related U.S. Application Data

(60) Provisional application No. 63/365,760, filed on Jun. 2, 2022.

(51) Int. Cl.
H10B 43/27 (2023.01)

(52) U.S. Cl.
CPC ............................... H10B 43/27 (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2019/0019807 A1* | 1/2019 | Gu | ......................... H10B 43/50 |
| 2021/0050252 A1 | 2/2021 | Zhang et al. | |
| 2021/0375670 A1 | 12/2021 | Zhang et al. | |
| 2022/0051930 A1* | 2/2022 | Gupta | ............... H01L 21/76816 |
| 2022/0051991 A1* | 2/2022 | Hopkins | ............ H04N 21/4222 |
| 2022/0310522 A1* | 9/2022 | Greenlee | ............. H01L 23/5386 |

* cited by examiner

*Primary Examiner* — William B Partridge
*Assistant Examiner* — Gustavo G Ramallo
(74) *Attorney, Agent, or Firm* — TraskBritt

(57) ABSTRACT

A method of forming a microelectronic device includes forming conductive interconnect structures vertically extending through isolation material to conductive contact structures coupled to pillar structures, forming a metal silicide material on the interconnect structures and the first isolation material, forming a conductive material on the metal silicide material, and forming a dielectric material over the conductive material. The method further includes forming openings vertically extending through the dielectric material, the conductive material, the metal silicide material, and the isolation material and forming additional isolation material to extend over remaining portions of the dielectric material and at least partially fill the openings. Related devices and systems are disclosed.

15 Claims, 8 Drawing Sheets

A

118

118A 700 nm

B

136

136A 700 nm

MICROELECTRONIC DEVICES WITH INCREASED GRAIN SIZE

CROSS-REFERENCE TO RELATED APPLICATION

This application claims the benefit under 35 U.S.C. § 119(e) of U.S. Provisional Patent Application Ser. No. 63/365,760, filed Jun. 2, 2022, the disclosure of which is hereby incorporated herein in its entirety by this reference.

TECHNICAL FIELD

The disclosure, in various embodiments, relates generally to the field of microelectronic devices and fabrication. More particularly, the disclosure relates to methods of forming microelectronic devices including conductive lines (e.g., data lines, also referred to as bit lines), and to related devices and systems.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. Conventional 3D NAND Flash memory devices include a vertical memory array with vertical memory strings including memory cells extending through openings in one or more stack structures including conductive materials and dielectric materials. Each vertical memory string may include at least one select device coupled in series to a serial combination of vertically-stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional) arrangements of transistors.

As the dimensions and spacing of the conductive features decrease, multilevel wiring structures have been used in memory devices (e.g., 3D NAND Flash memory devices) to electrically connect the conductive features to one another. The memory device includes the wiring structures at different levels, with the wiring structures formed of electrically conductive materials to provide conductive pathways through the memory device. As the dimensions and spacing of the conductive features continue to decrease, resistivity of the conductive features and parasitic (e.g., stray) capacitance between adjacent conductive features within the memory devices increases. The increased parasitic capacitance can effectuate higher power demands and signal delay during use and operation of the memory device. Furthermore, as the dimensions and spacing of the conductive features decrease, shorting margin between adjacent conductive features within the memory device decreases. Compressive features within the memory devices can also decrease shorting margin between laterally adjacent conductive features.

DETAILED DESCRIPTION

Figure 1A:
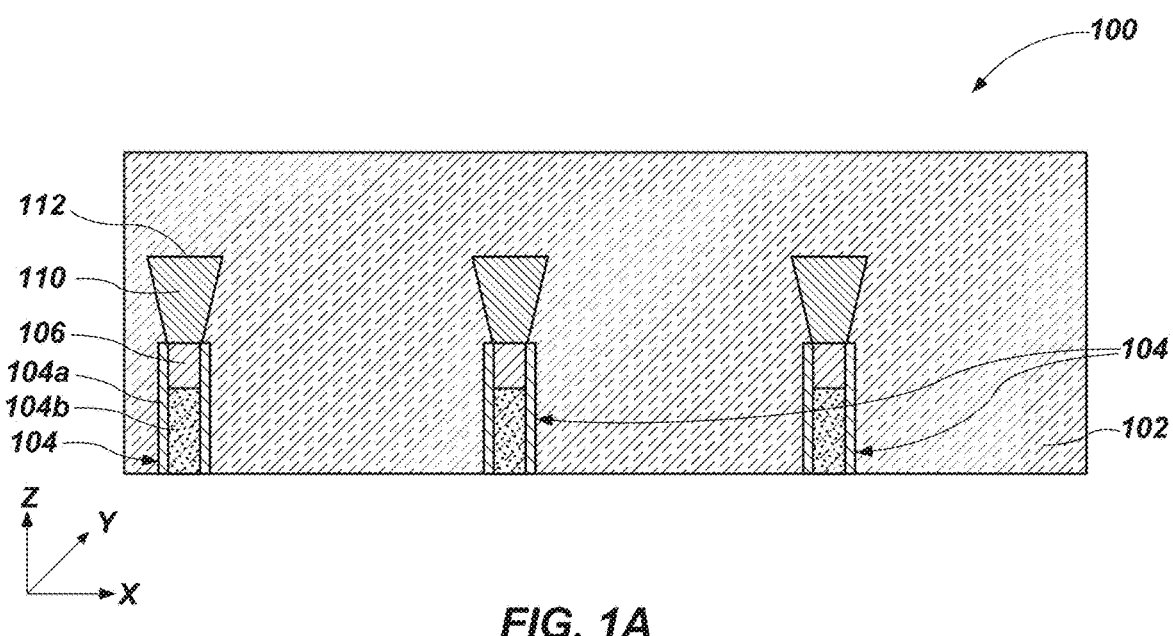
FIGS. 1A through 1F are simplified, partial longitudinal cross-sectional views of a microelectronic device structure at various processing stages of a method of forming a microelectronic device, in accordance with embodiments of the disclosure.

Microelectronic devices (e.g., apparatuses, semiconductor devices, memory devices) including a metal silicide liner underlying conductive lines (e.g., data lines, bit lines), and related systems and methods of forming the microelectronic devices are described herein. The microelectronic devices include pillar structures extending vertically through a first isolation material. The metal silicide liner is disposed over the pillar structures. The conductive lines are formed directly vertically adjacent to the metal silicide liner, according to a template provided by the metal silicide liner, and are operatively coupled to the pillar structures. Dielectric structures are formed over the conductive lines. Openings are formed to extend horizontally between laterally neighboring conductive lines. A second isolation material is formed over the dielectric structures and may at least partially fill the openings. If the second isolation material is formed to only partially (e.g., less than completely) fill the openings, remaining portions of the openings may form air gaps laterally interposed between laterally neighboring conductive lines.

A configuration (e.g., material composition, density, grain sizes, grain size distribution) of the metal silicide liner may be selected to provide a desired template for forming the conductive lines. The conductive lines may be formed to have an increased grain size, decreased resistivity, and increased tensile stress as compared to conventional conductive lines formed by conventional methods. The increased tensile stress may advantageously compensate for compressive stress exhibited by the overlying dielectric structures. The resistivity of the conductive lines may be decreased within a range of from about 5% to about 20%, as compared to conventional conductive lines formed by conventional methods. The decreased resistivity may advantageously permit formation of relatively thinner conductive lines and enhance feature density and device miniaturization as compared to conventional microelectronic devices formed by conventional methods.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed using conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the phrase "coupled to" refers to structures operatively connected with each other, such as electrically connected through a direct Ohmic connection or through an indirect connection (e.g., by way of another structure).

As used herein, the term "configured" refers to a size, shape, material composition, and arrangement of one or more of at least one structure and at least one apparatus facilitating operation of one or more of the structure and the apparatus in a pre-determined way.

As used herein, a "memory device" means and includes electronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), an electronic device combining logic and memory, and a graphics processing unit (GPU) incorporating memory.

As used herein, the term "integrated circuit" or "integrated circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3D NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be assembled with through-silicon via (TSV) technologies.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "pitch" refers to a distance between identical points in two adjacent (e.g., neighboring) features.

As used herein, features (e.g., regions, structures, devices) described as "neighboring" one another means and includes features of the disclosed identity (or identities) that are located most proximate (e.g. closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, "conductive material" means and includes an electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, a Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes an electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), and a magnesium oxide ($MgO_x$)), at least one dielectric nitride material (e.g., a silicon nitride ($SiN_y$)), at least one dielectric oxynitride material (e.g., silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, "semiconductor material" or "semiconductive material" refer to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), gallium oxide ($Ga_xO$), indium oxide ($In_xO$), tin oxide ($Sn_xO$), titanium oxide ($Ti_xO$), other binary metal oxides, zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "substantially" in reference to a given parameter, property, or condition means and includes to a degree that one of ordinary skill in the art would understand that the given parameter, property, or condition is met with a degree of variance, such as acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

Figure 1B:
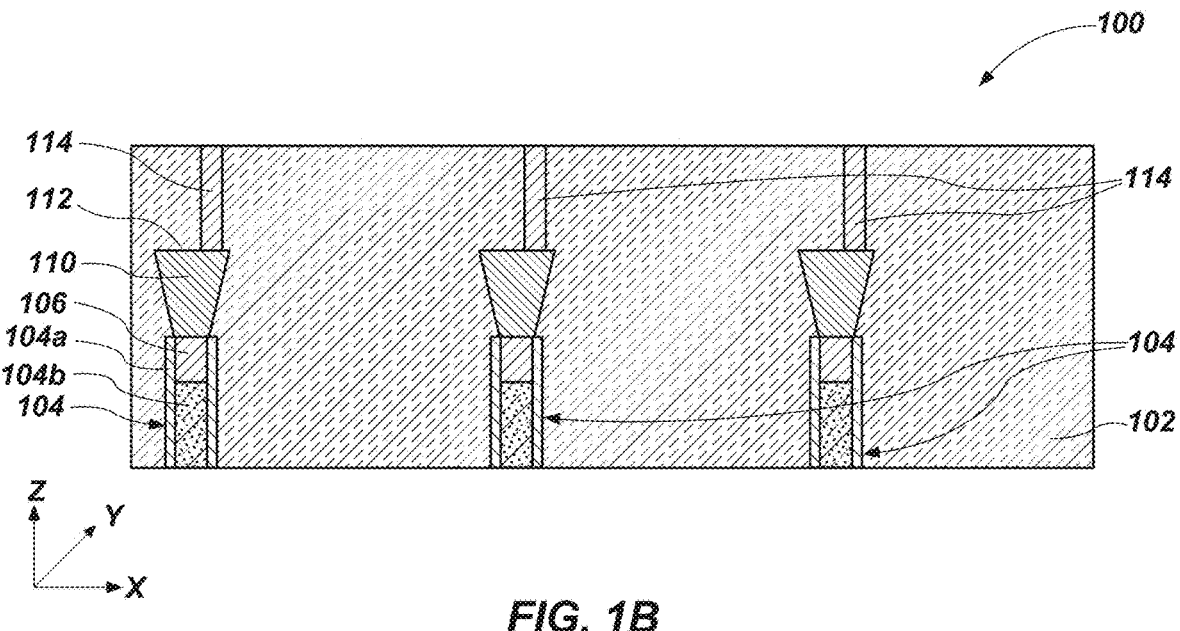
Figure 1C:
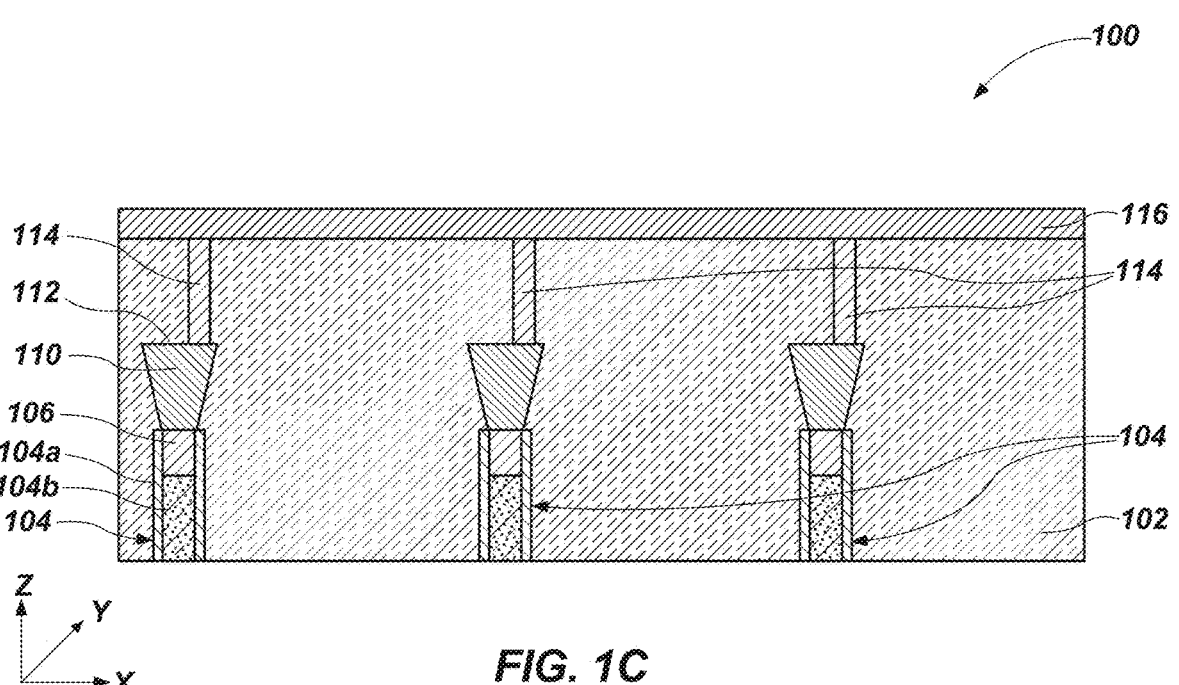
Figure 1D:
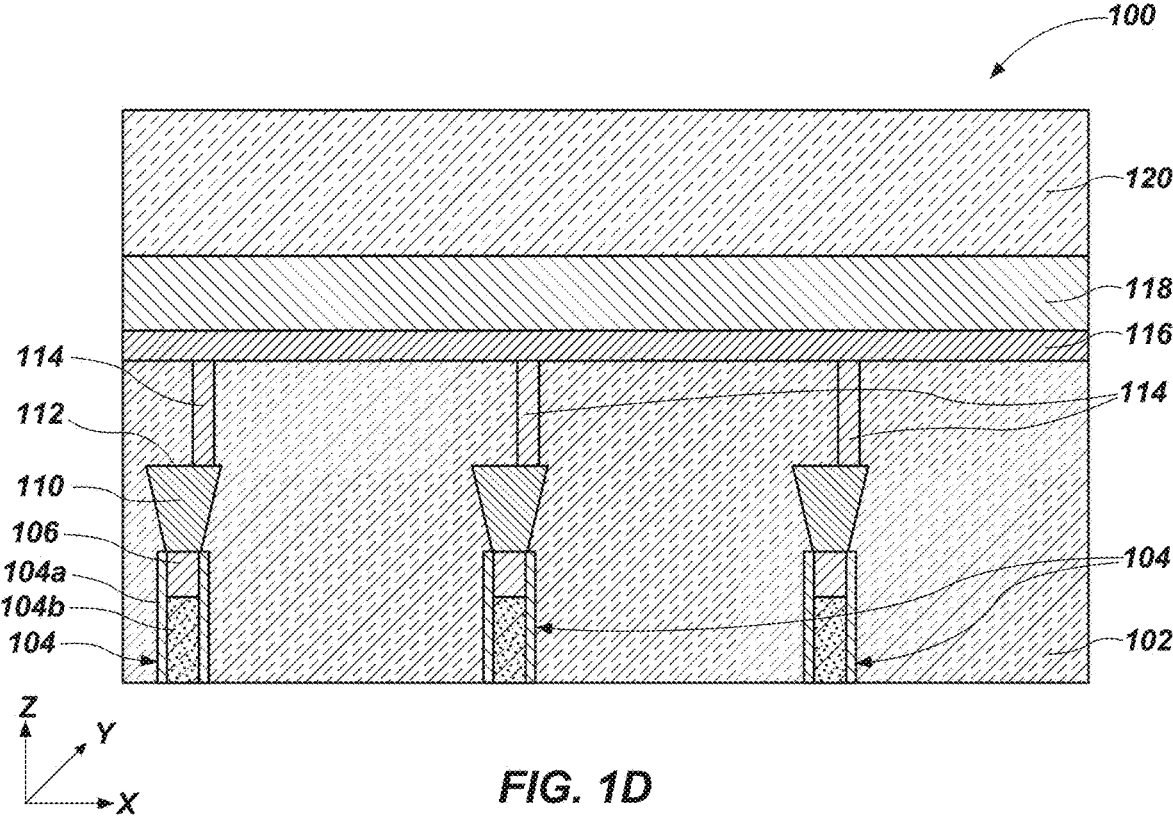
Figures 1E, 1F:
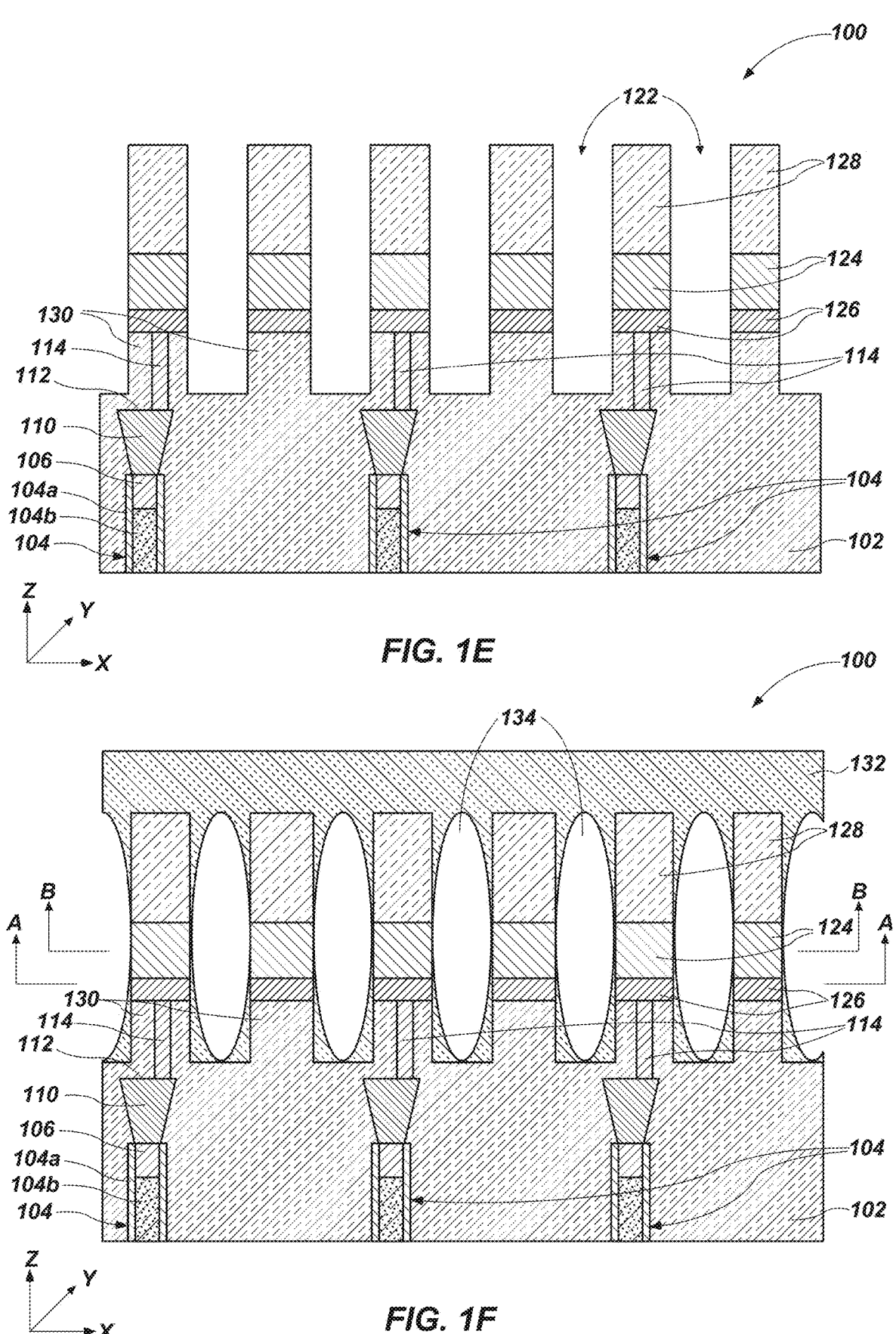
Figure 1G:
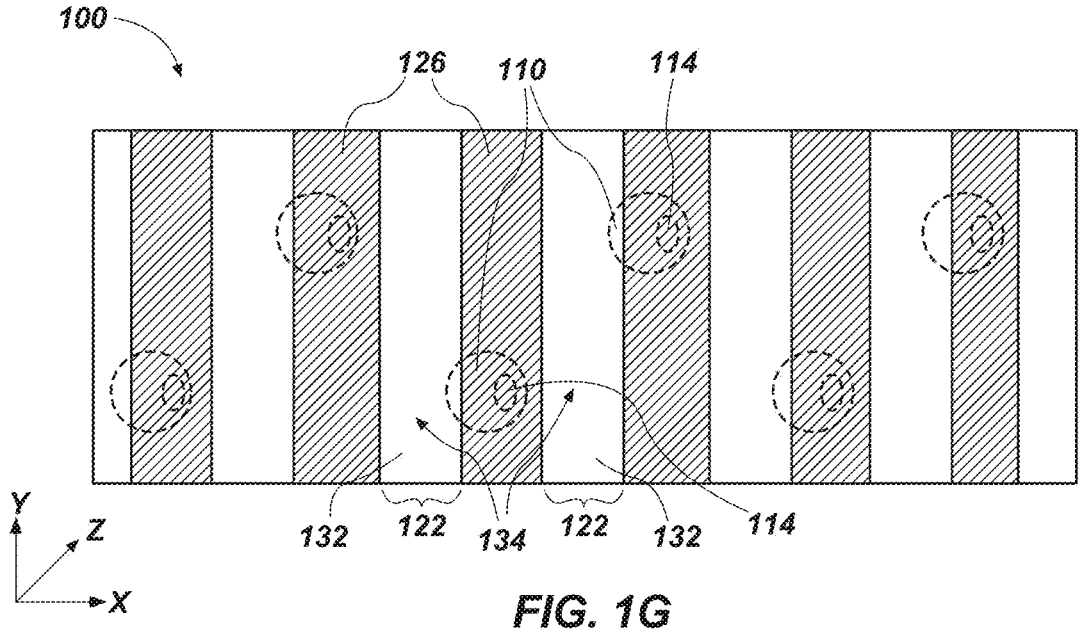
FIG. 1G is a simplified, partial lateral cross-sectional view of the microelectronic device structure at the processing stage of FIG. 1F taken along the A-A line in FIG. 1F.
Figure 1H:
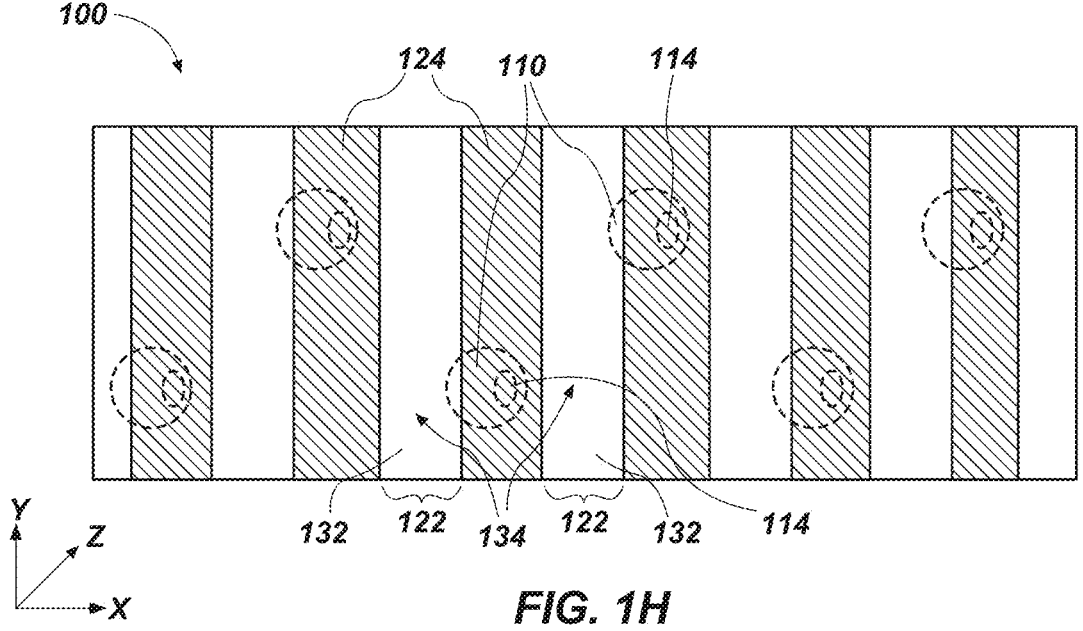
FIG. 1H is a simplified, partial lateral cross-sectional view of the microelectronic device structure at the processing stage of FIG. 1F taken along the B-B line in FIG. 1F.
Figure 3:
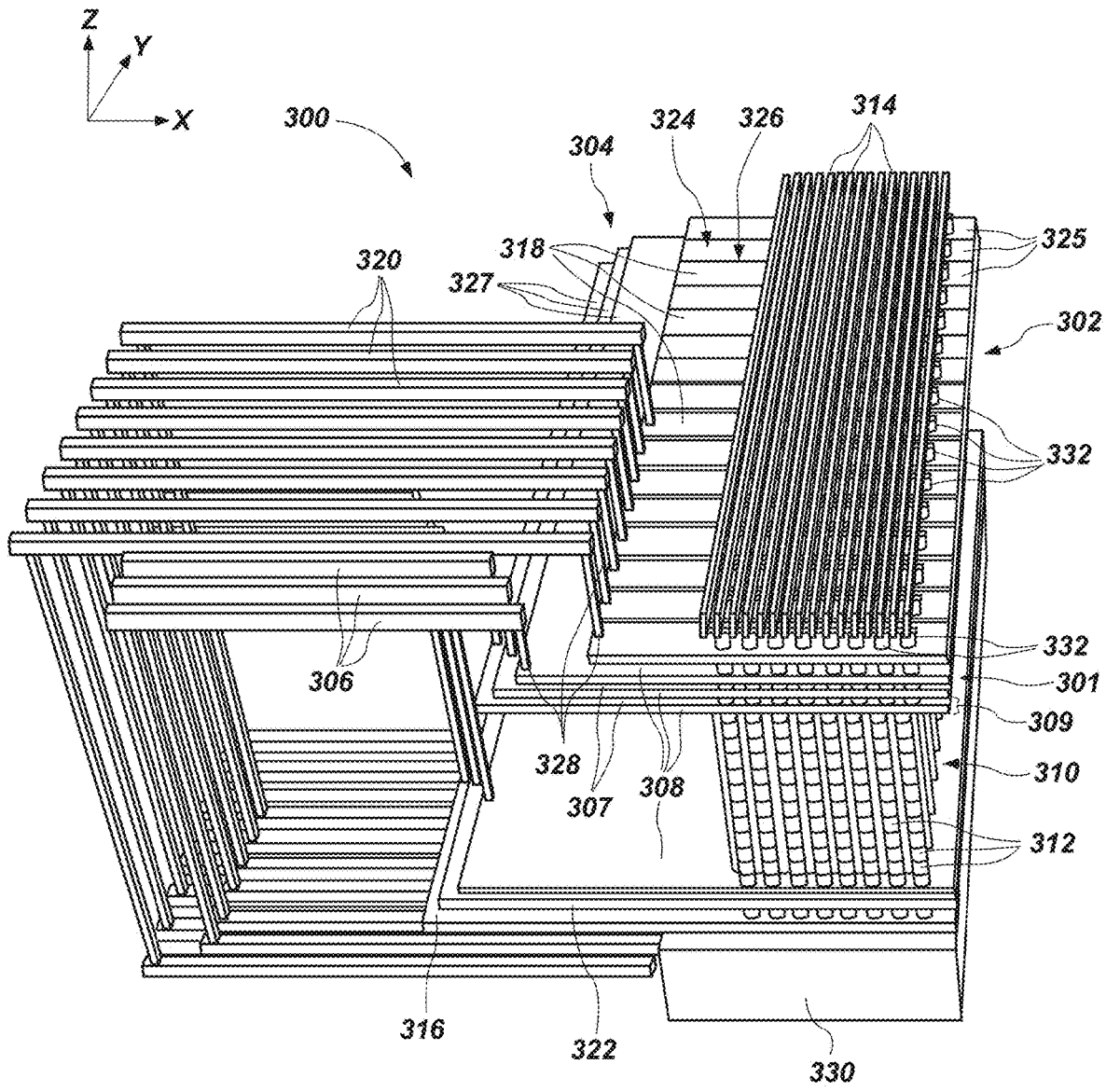
FIG. 3 is a partial cutaway perspective view of an electronic device, in accordance with embodiments of the disclosure.

FIGS. 1A through 1H are various views (described in further detail below) illustrating a microelectronic device structure at different processing stages of a method of forming a microelectronic device (e.g., a memory device, such as a 3D NAND Flash memory device), in accordance with embodiments of the disclosure. For convenience in describing the features depicted in FIGS. 1A through 1H, a first direction is defined, shown in FIGS. 1A through 1H, as an X-direction. A second direction, which is transverse (e.g., perpendicular) to the first direction is defined, shown in FIGS. 1A through 1F, as a Z-direction. A third direction which is transverse to each of the first direction and the second direction is defined, as shown in FIGS. 1G and 1H, as a Y-direction. Similar directions are defined, as shown in FIG. 3, as discussed in greater detail below. With the description provided below, it will be readily apparent to one of ordinary skill in the art that the methods described herein may be used for forming various devices. In other words, the methods of the disclosure may be used whenever it is desired to form an integrated circuit device.

FIG. 1A is simplified, partial longitudinal cross-sectional view of a microelectronic device structure 100 during a processing stage of a method of forming a microelectronic device, in accordance with embodiments of this disclosure. As shown in FIG. 1A, the microelectronic device structure 100 may be formed to include a first isolation material 102, pillar structures 104 partially vertically extending through first isolation material 102, in contact (e.g., physical contact, electrical contact) with upper portions of the conductive plug structures 106, and contact structures 110 in contact (e.g., physical contact, electrical contact) with the conductive plug structures 106.

The first isolation material 102 may be formed of and include at least one dielectric material, such as one or more of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), a dielectric nitride material (e.g., $SiN_y$), a dielectric oxynitride material (e.g., $SiO_xN_y$), and a dielectric carboxynitride material (e.g., $SiO_xC_zN_y$). In some embodiments, the first isolation material 102 is formed of and include $SiO_2$. In some embodiments, the first isolation material 102 may be formed on or over one or more additional features (e.g., materials, structures, devices, regions) of the microelectronic device structure 100. By way of non-limiting example, the isolation material 102 may be formed on or over a stack structure including a vertically alternating sequence of conductive material and insulative material arranged in tiers. Each of the tiers may individually include conductive material vertically neighboring the insulative material.

The pillar structures 104 may partially (e.g., less than completely) vertically extend through the first isolation material 102. Portions of the pillar structures 104 may also vertically extend through additional features (e.g., the stack structure) vertically underlying the first isolation material 102. The pillar structures 104 may be formed in an array region of the microelectronic device structure 100, and may be configured as memory cell pillar structures facilitating the formation of vertically extending strings of memory cells within the array region of the microelectronic device structure 100, as described in further detail below.

The pillar structures 104 may individually exhibit a desirable geometry configuration (e.g., size, shape), and may also be distributed relative to one another in a desirable manner within the array region of the microelectronic device structure 100. In some embodiments, the array region exhibits a hexagonal distribution (e.g., a hexagonal pattern) of the pillar structures 104. A pitch between pillar structures 104 horizontally neighboring one another may be within a range of from about 20 nm to about 200 nm, such as from about 20 nm to about 50 nm, from about 50 nm to about 100 nm, from about 100 nm to about 150 nm, or from about 150 nm to about 200 nm. A critical dimension of an individual pillar structure 104 in a horizontal direction may be within a range of from about 20 nm to about 200 nm, such as from about 20 nm to about 50 nm, from about 50 nm to about 100 nm, from about 100 nm to about 150 nm, or from about 150 nm to about 200 nm. The pillar structures 104 may be formed within and may at least partially fill openings vertically extending (e.g., in the Z-direction) through the first isolation material 102 and underlying additional features (e.g., the stack structure) of the microelectronic device structure 100. The pillar structures 104 may be high aspect ratio (HAR) structures, such as structures having an HAR of at least about 20:1, at least about 50:1, at least about 100:1, at least about 150:1, or at least about 200:1. Sidewalls of the first isolation material 102 partially defining the openings may be substantially vertical or sloped.

The pillar structures 104 may each individually be formed of and include a stack of materials. For example, each of the pillar structures 104 may include cell films 104a surrounding a dielectric fill material 104b (e.g., a dielectric oxide, a dielectric nitride, air). The cell films 104a may, for example, include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second dielectric oxide material (e.g., $SiO_x$, such as $SiO_2$); and a channel material, such as a semiconductor material (e.g., silicon, such as polycrystalline Si). For ease of understanding the drawings and related description cell films 104a are depicted as a single film in FIG. 1A. However, it will be understood that the cell films 104a of each pillar structure 104 include a stack of multiple films. The charge-blocking material may be formed on surfaces of the microelectronic device structure 100 defining the openings containing the pillar structures 104; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material 104b may be horizontally surrounded by the channel material.

Intersections of the pillar structures 104 and the conductive structures of a stack structure underlying isolation material 102 may define vertically extending strings of memory cells coupled in series with one another within the stack structure. In some embodiments, the memory cells formed at the intersections of the conductive structures and the pillar structures 104 within different tiers of the stack structure comprise so-called "MONOS" (metal-oxide-nitride-oxide-semiconductor) memory cells. In additional embodiments, the memory cells comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the pillar structures 104 and the conductive structures of the different tiers of the stack structure.

Still referring to FIG. 1A, the conductive plug structures 106 (e.g., drain contact plugs) may be formed within upper portions of the pillar structures 104. The conductive plug structures 106 may be formed vertically on or over the fill material 104b of the pillar structures 104, and inwardly laterally adjacent to the channel material of the cell films 104a of the pillar structures 104. The conductive plug structures 106 may be formed of and include semiconductor material, such as one or more of polycrystalline silicon, silicon germanium, and germanium. The conductive plug structures 106 may be conductively doped.

The contact structures 110 (e.g., conductive contacts, digit line contacts) may be formed on or over the conductive plug structures 106. For example, the contact structures 110 may be formed to physically contact upper surfaces of the conductive plug structures 106.

The contact structures 110 may be formed of and include at least one conductive material, such as one or more of at least one metal, at least one alloy, at least one conductive metal oxide, at least one conductive metal nitride, at least one conductive metal silicide, and at least one conductively doped semiconductor material. By way of non-limiting example, the contact structures 110 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_x$), ruthenium (Ru), ruthenium oxide ($RuO_x$), and conductively doped silicon. In some embodiments, the contact structures 110 are individually formed of and include tungsten (W).

Sidewalls of the contact structures 110 may be substantially vertical, may be sloped (e.g., tapered). Sidewalls of an individual contact structure 110 may exhibit a tapered profile with an upper portion of the contact structure 110 having a greater horizontal dimension (e.g., horizontal width, horizontal diameter) than a lower portion thereof, as shown in FIG. 1A. In additional embodiments, sidewalls of the contact structures 110 exhibit different profiles than those depicted in FIG. 1A, such as a substantially orthogonal (e.g., substantially rectangular) profiles, dish-shaped profiles, or a different profile. A portion of an individual contact structure 110, such as an upper portion proximate an upper surface 112 of the contact structure 110, may horizontally extend beyond horizontal boundaries (e.g., sidewalls) of the pillar structure 104 operatively associated therewith (e.g., vertically under and in electrical communication therewith). Portions of the first isolation material 102 may surround and substantially cover the sidewalls and the upper surfaces 112 of the contact structures 110.

Referring to next FIG. 1B, which is a simplified, partial longitudinal cross-sectional view of the microelectronic device structure 100 at a processing stage of the method of forming a microelectronic device following the processing stage of FIG. 1A, interconnect structures 114 (e.g., contact vias, bit line vias) may be formed to vertically extend through portions of the first isolation material 102 and contact the contact structures 110. The interconnect structures 114 may, for example, be formed to physically contact (e.g., "land on") the upper surfaces 112 of the contact structures 110. For example, portions of the first isolation material 102 overlying the contact structures 110 may be removed (e.g., through a conventional photolithographic patterning and etching process) to form openings (e.g., vias) overlying and partially exposing the upper surfaces 112 of the contact structures 110, a conductive material may be formed within the openings, and the portions of the conductive material outside of boundaries (e.g., horizontal boundaries, vertical boundaries) of the openings may be removed (e.g., through a CMP process) to form the interconnect structures 114. The openings may be at least partially defined by sidewalls of the first isolation material 102 and the upper surfaces 112 of the contact structures 110.

As shown in FIG. 1B, the interconnect structures 114 may be formed to have relatively smaller horizontal areas than the upper surfaces 112 of the contact structures 110, and horizontal centers of the interconnect structures 114 may be laterally offset (e.g., positioned off-center, staggered) with respect to horizontal centers of the contact structures 110. In addition, at least one of the interconnect structures 114 have a different horizontal area (e.g., a larger horizontal area, a smaller horizontal area) than those shown in FIG. 1B, and/or a horizontal center of at least one of the interconnect structures 114 may be substantially aligned with a horizontal center of at least one of the contact structures 110. The interconnect structures 114 extend vertically (e.g., in the Z-direction) from the contact structures 110. Upper boundaries (e.g., upper surfaces) of the interconnect structures 114 may be formed substantially coplanar with an upper boundary (e.g., an upper surface) of the isolation material 102.

The interconnect structures 114 may be formed of and include at least one conductive material, such as one or more of at least one metal, at least one alloy, at least one conductive metal oxide, at least one conductive metal nitride, at least one conductive metal silicide, and at least one conductively doped semiconductor material. By way of a non-limiting example, the interconnect structures 114 may be formed of and include one or more of W, $WN_y$, Ni, Ta, $TaN_y$, $TaSi_x$, Pt, Cu, Ag, Au, Al, Mo, Ti, $TiN_y$, $TiSi_x$, $TiSi_xN_y$, $TiAl_xN_y$, $MoN_x$, Ir, $IrO_x$, Ru, $RuO_x$, and conductively doped silicon. In some embodiments, the interconnect structures 114 are formed of and include tungsten (W). The interconnect structures 114 may or may not include substantially the same material composition as the contact structures 110.

Referring to next FIG. 1C, which is a simplified, partial longitudinal cross-sectional view of the microelectronic device structure 100 at a processing stage of the method of forming a microelectronic device following the processing stage of FIG. 1B, a liner material 116 is formed (e.g., deposited) on or over the first isolation material 102 and the interconnect structures 114. The liner material 116 may be amorphous as formed. The liner material 116 may horizontally extend substantially continuously on or over upper surfaces of the first isolation material 102 and the interconnect structures 114. In addition, an upper surface of the liner material 116 may be substantially planar, and may extend substantially parallel to the upper surfaces of the first isolation material 102 and the interconnect structures 114. The liner material 116 may be formed to have a vertical thickness (e.g., height) within a range of from about 10 Angstroms (Å) to about 50 Å, such as from about 10 Å to about 25 Å, from about 10 Å to about 15 Å, from about 10 Å to about 17 Å, from about 10 Å to about 20 Å, from about 15 Å to about 20 Å, from about 15 Å to about 25 Å, from about 17 Å to about 22 Å, from about 20 Å to about 25 Å, from about 20 Å to about 40 Å, from about 25 Å to about 50 Å, or from about 30 Å to about 50 Å.

The liner material 116 may be formed of and include metal silicide material, such as one or more of tungsten silicide ($WSi_x$), tantalum silicide ($TaSi_x$), titanium silicide ($TiSi_x$), nickel silicide ($NiSi_x$), or copper silicide ($CuSi_x$). In some embodiments, the liner material 116 is formed of and includes tungsten silicide ($WSi_x$). The liner material 116 may include a single (e.g., only one) metal silicide material, or may include multiple (e.g., more than one) metal silicide materials. For example, the liner material 116 may include a stack of two or more metal silicide materials. The metal silicide material may include a stoichiometric amount of silicon or a non-stoichiometric amount of silicon. In addition, the liner material 116 may, optionally, include one or more additives to increase a crystallization temperature of the liner material 116. The one or more additives may be present in the liner material 116 within a range of from about 5% by weight (wt %) to about 10 wt %. The liner material 116 may improve adhesion between a subsequently formed conductive material, and the interconnect structures 114, as described in further detail below with reference to FIG. 1D.

A top surface of the liner material 116 may serve as a template for a conductive material formed thereon. An amount of silicon in the liner material 116 may be selected to facilitate desirable characteristics for the template. For example, an amount of silicon in the liner material 116 may be within a range of from about 1 mole percent (mol %) to about 60 mol %, such as from about 1 mol % to about 5 mol %, from about 1 mol % to about 10 mol %, from about 1 mol % to about 13 mol %, from about 5 mol % to about 15 mol %, from about 10 mol % to about 20 mol %, from about 13 mol % to about 54 mol %, from about 15 mol % to about 30 mol %, from about 20 mol % to about 40 mol %, from about 20 mol % to about 50 mol %, from about 30 mol % to about 40 mol %, from about 30 mol % to about 50 mol %, from about 40 mol % to about 50 mol %, from about 40 mol % to about 60 mol %, from about 50 mol % to about 60 mol %, or from about 54 mol % to about 60 mol %. In addition, an average grain size of metal silicide particles within the liner material 116 may also be selected to facilitate desirable characteristics for the template. For example, the average grain size of the metal silicide material of the liner material 116 may be within a range of from about 0.2 nanometer (nm) to about 2 nm, such as from about 0.2 nm to about 0.5 nm, from about 0.2 nm to about 1 nm, from about 0.2 nm to about 1.5 nm, from about 0.5 nm to about 1 nm, from about 0.5 nm to about 1.2 nm, from about 0.5 to about 2 nm, from about 1 nm to about 1.5 nm, from about 1 nm to about 2 nm, from about 1.2 nm to about 2 nm, or from about 1.5 nm to about 2 nm. In some embodiments, the liner material 116 is at least substantially amorphous.

Referring to next FIG. 1D, which is a simplified, partial longitudinal cross-sectional view of the microelectronic device structure 100 at a processing stage of the method of forming a microelectronic device following the processing stage of FIG. 1C, conductive material 118 may be formed on or over the liner material 116, and dielectric material 120 may be formed on or over the conductive material 118. The conductive material 118 may be formed to horizontally extend substantially continuously on or over the liner material 116, and may exhibit a substantially planar upper surface that extends substantially parallel to the upper surface of the liner material 116. In addition, the dielectric material 120 may be formed to horizontally extend substantially continuously on or over the conductive material 118, and may exhibit a substantially planar upper surface that extends substantially parallel to the upper surface of the conductive material 118.

The conductive material 118 may have a vertical thickness corresponding to (e.g., substantially the same as) a desired vertical thickness of subsequently formed conductive structures 124 (e.g., data lines, digit lines, bit lines), as described in greater detail with reference to FIGS. 1E and 1F. For example, the conductive material 118 may be formed to have a vertical thickness greater than or equal to about 100 Å, such as within a range of from about 100 Å to about 2000 Å, from about 100 Å to about 150 Å, from about 100 Å to about 200 Å, from about 150 Å to about 200 Å, from about 100 Å to about 300 Å, from about 100 Å to about 600 Å, from about 150 Å to about 300 Å, from about 150 Å to about 600 Å, from about 300 Å to about 600 Å, from about 100 Å to about 1000 Å, from about 100 Å to about 1000 Å, or from about 150 Å to about 2000 Å. In some embodiments the conductive material 118 is formed to have a vertical thickness within a range of from about 100 Å to about 600 Å.

The conductive material 118 may be formed of and include at least one conductive material, such as one or more of a metal, an alloy, a conductive metal oxide, a conductive metal nitride, a conductive metal silicide, and a conductively doped semiconductor material. By way of non-limiting example, the conductive material 118 may be formed of and include one or more of W, $WN_y$, Ni, Ta, $TaN_y$, $TaSi_x$, Pt, Cu, Ag, Au, Al, Mo, Ti, $TiN_y$, $TiSi_x$, $TiSi_xN_y$, $TiAl_xN_y$, $MoN_x$, Ir, $IrO_x$, Ru, $RuO_x$, and conductively doped silicon. In some embodiments, the conductive material 118 is formed of and includes tungsten (W). The conductive material 118 may include substantially the same material composition as or a different material composition than the contact structures 110 and/or the interconnect structures 114.

A mean grain size (e.g., average grain size) of the conductive material 118 may be controlled by the configuration (e.g., material composition, silicon concentration, grain sizes) of the liner material 116. The mean grain size of the conductive material 118 may be greater than or equal to about 200 nm, within a range of from about 200 nm to about 800 nm, from about 200 nm to about 700 nm, from about 250 nm to about 700 nm, from about 250 nm to about 650 nm, from about 300 nm to about 650 nm, from about 350 nm to about 650 nm, from about 400 nm to about 650 nm, from about 450 nm to about 650 nm, from about 500 nm to about 650 nm, from about 500 nm to about 600 nm, or from about 550 nm to about 600 nm. In some embodiments, the mean grain size of the conductive material 118 is within a range of from about 250 nm to about 650 nm. Grains of the conductive material 118 may individually have a grain size within a range of from about 100 nm to about 1000 nm, such as from about 100 to about 800 nm, from about 200 to about 700 nm, or from about 250 nm to about 650 nm. In some embodiments the conductive material 118 is formed through a PVD process permitting the mean grain size of the conductive material 118 to be controlled to be within the range of from about 200 nm to about 800 nm using the liner material 116 as a template.

The conductive material 118 may be formulated and configured to have a desirable tensile stress. The tensile stress exhibited by the conductive material may be controlled by the configuration (e.g., material composition, silicon concentration, grain sizes) of the liner material 116. The conductive material 118 may, for example, be formed to have a tensile stress greater than about 1000 MPa. For example, the conductive material 118 may have a tensile stress within a range of from about 1000 MPa to about 1500 MPa, from about 1000 MPa to about 2000 MPa, from about 1500 MPa to about 1800 MPa, from about 1500 MPa to about 2000 MPa, from about 1500 MPa to about 2600 MPa, from about 1800 MPa to about 2000 MPa, from about 1800 MPa to about 2200 MPa, from about 1800 MPa to about 2600 MPa, from about 2000 MPa to about 2200 MPa, or from about 2000 MPa to about 2600 MPa. The conductive material 118, as influenced by the liner material 116 thereunder serving as a template to achieve the grain sizes and associated properties of the conductive material 118, may have greater tensile stress in comparison to conductive material formed in the absence of the liner material 116.

With continued reference to FIG. 1D, the dielectric material 120 may be formed of and include a material that is selectively removable (e.g., selectively etchable) relative to the conductive material 118 and the liner material 116. The dielectric material 120 may function as a mask material (e.g., a hard mask material). By way of non-limiting example, the dielectric material 120 may be formed of and include one or more of amorphous carbon, a dielectric oxide material (e.g., silicon oxide, aluminum oxide), a dielectric nitride material (e.g., silicon nitride), a dielectric oxycarbide material (e.g., silicon oxycarbide), and a dielectric oxynitride material (e.g., silicon oxynitride). In some embodiments, the dielectric material 120 is formed of and includes amorphous carbon. In additional embodiments, the dielectric material 120 is formed of and includes silicon nitride (e.g., $Si_3N_4$). In further embodiments, the dielectric material 120 is formed of and includes silicon oxide (e.g., $SiO_2$). The dielectric material 120 may be homogeneous or may be heterogeneous.

Referring next to FIG. 1E, which is a simplified, partial longitudinal cross-sectional view of the microelectronic device structure 100 at a processing stage of the method of forming a microelectronic device following the processing stage of FIG. 1D, portions of the dielectric material 120 (FIG. 1D), the conductive material 118 (FIG. 1D), the liner material 116 (FIG. 1D), and the first isolation material 102 may be removed to form openings 122 (e.g., trenches). The openings 122 may vertically terminate within the first isolation material 102, such as locations vertically overlying the upper surfaces 112 of the contact structures 110. As shown in FIG. 1E, the formation of the openings 122 may form dielectric structures 128 from remaining portions of the dielectric material 120 (FIG. 1D), the conductive structures 124 (e.g., conductive lines, such as digit lines) from remaining portions of the conductive material 118 (FIG. 1D), liner structures 126 from remaining portions of the liner material 116 (FIG. 1D), and isolation material projections 130 from remaining upper portions of the first isolation material 102. The openings 122 may individually be horizontally interposed in the X-direction between horizontally neighboring conductive structures 124 (and, hence, horizontally neighboring dielectric structures 128, horizontally neighboring liner structures 126, and horizontally neighboring isolation material projections 130), and may extend in parallel with one another in the Y-direction.

The openings 122 may be formed by first patterning the dielectric material 120 (FIG. 1D) to form initial openings, and then vertically extending the initial openings into the conductive material 118 (FIG. 1D), the liner material 116 (FIG. 1D), and the first isolation material 102. For example, the dielectric material 120 (FIG. 1D) may be subjected to a first material removal process employing photolithographic patterning and anisotropic etching, and then the resulting pattern of the dielectric structures 128 may be used as a mask for at least one additional material removal process employing anisotropic etching to form the openings 122.

Sidewalls of each of the dielectric structures 128, the conductive structures 124, the liner structures 126, and the isolation material projections 130 defining horizontal boundaries of the openings 122 may be substantially vertically oriented and substantially planar. In additional embodiments, sidewalls of one or more of the dielectric structures 128, the conductive structures 124, the liner structures 126, and the isolation material projections 130 are at least partially vertically sloped and/or at least partially non-planar. The dielectric structures 128, the conductive structures 124, the liner structures 126, and the isolation material projections 130 may be configured such that at least a portion of the outer side surfaces of each of the dielectric structures 128, conductive structures 124, liner structures 126, and the isolation material projections 130 form elongated, continuous portions along at least one side thereof. For example, the sidewalls of each of the dielectric structures 128, the conductive structures 124, the liner structures 126, and the isolation material projections 130 defining the openings 122 may be substantially horizontally aligned with one another in the X-direction. The dielectric structures 128, the conductive structures 124, the liner structures 126, and the isolation material projections 130 may have a substantially uniform width in the X-direction.

The openings 122 may be formed to have any suitable vertical dimension (e.g., height in the Z-direction) A total vertical dimension of the openings 122 may substantially correspond to a combined vertical dimension (e.g., height in the Z-direction) of the dielectric structures 128, the conductive structures 124, the liner structures 126, and the isolation material projections 130. The openings 122 may vertically extend from upper surfaces of the dielectric structures 128 and may vertically terminate within the first isolation material 102, without extending to the upper surfaces 112 of the contact structures 110. The openings 122 may have any suitable profile when viewed from the X-Z plane, such as a U-shaped profile, rectangular profile, or a polygonal profile. The openings 122 may be formed to have any suitable horizontal width (e.g., in the X-direction) greater than or equal to about 7 nm. For example, the openings 122 may individually have a horizontal width in the X-direction within a range of from about 7 nm to about 200 nm, such as from about 7 nm to about 8 nm, from 7 nm to about 9 nm, from about 7 nm to about 10 nm, from about 7 nm to about 15 nm, from about 7 nm to about 20 nm, from about 10 nm to about 15 nm, from about 10 nm to about 20 nm, from about 10 nm to about 50 nm, from about 50 nm to about 100 nm, from about 100 nm to about 150 nm, or from about 150 nm to about 200 nm. In some embodiments, the horizontal width in the X-direction of an individual opening 122 is within a range of from about 7 nm to about 9 nm.

Referring to FIG. 1F, which is a simplified, partial longitudinal cross-sectional view of the microelectronic device structure 100 at a processing stage of the method of forming a microelectronic device following the processing stage of FIG. 1E, a second isolation material 132 may be formed (e.g., non-conformally deposited) on or over the dielectric structures 128 and may substantially cover the openings 122 (FIG. 1E) to form air gaps 134 from remaining (e.g., unfilled) portions of the openings 122 (FIG. 1E). As shown in FIG. 1F, the second isolation material 132 may be formed to have a substantially planar upper boundary (e.g., upper surface), and a non-planar lower boundary (e.g., lower surface). FIG. 1G illustrates a simplified, partial lateral cross-sectional view of the microelectronic device structure 100 at the processing stage of FIG. 1F taken along a line A-A in FIG. 1F. FIG. 1H illustrates a simplified, partial lateral cross-sectional view of the microelectronic device structure 100 at the processing stage of FIGS. 1F and 1G taken along a line B-B in FIG. 1F.

Portions of the second isolation material 130 may vertically extend into and partially fill the openings 122 (FIG. 1E). For example, portions of the second isolation material 130 may extend below upper surfaces of the dielectric structures 128 and may at least partially cover sidewalls of at least the dielectric structures 128. In some embodiments, portions of the second isolation material 130 cover sidewalls of the dielectric structures 128, the conductive structures 124, the liner structures 126, and the isolation material projections 130. The air gaps 134 may comprise portions of the openings 122 (FIG. 1E) not occupied by portions of the second isolation material 130, and may be substantially covered by the second isolation material 130. In additional embodiments, the second isolation material 130 substantially fills the openings 122, such that the air gaps 134 are not formed. The second isolation material 130 may be laterally (e.g., in the X-direction) adjacent to and in direct contact with the dielectric structures 128, and, optionally, one or more (e.g., each) of the conductive structures 124, the liner structures 126, and the isolation material projections 130.

The second isolation material 132 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$) at least one dielectric carboxynitride material (e.g., $SiO_xC_zN_y$), and amorphous carbon. In some embodiments, the second isolation material 132 is formed of and includes $SiO_2$. In additional embodiments, the second isolation material 132 is formed of and includes a low-K dielectric material. The second isolation material 132 may or may not have substantially the same material composition as the first isolation material 102. The second isolation material 132 may be substantially homogeneous or may be heterogeneous. The second isolation material 130 and the air gaps 134 (if any) may mitigate parasitic (e.g., stray) capacitance between adjacent conductive structures 124.

In some embodiments, a majority of a volume of each of the openings 122 (FIG. 1E) remain substantially free of the second isolation material 132, as depicted in FIG. 1F, to form the air gaps 134. The second isolation material 132 may be formed proximate upper vertical boundaries of the openings 122 (FIG. 1E) and may substantially continuously extend from and between horizontally neighboring dielectric structures 128 to substantially completely cover the air gaps 134. The air gaps 134 may be filled with gaseous material (e.g., air, oxygen, nitrogen, argon, helium). Upper boundaries of the air gaps 134 may be defined by lower boundaries (e.g., a lower surface) of the second isolation material 132. Lower boundaries of the air gaps 134 may be defined by surfaces of the first isolation material 102 and/or surfaces of second isolation material 132 disposed along the first isolation material 102 at the bottom of the openings 122 (FIG. 1E).

The air gaps 134 may be laterally (e.g., in the X-direction) adjacent to the dielectric structures 128, the conductive structures 124, the liner structures 126, and the isolation material projections 130. At least a portion of the air gaps 134 may be disposed directly adjacent to (e.g., in direct contact with) the conductive structures 124. The air gaps 134 may individually partially horizontally overlap (e.g., in the X-direction) one or more of the contact structures 110. The air gaps 134 may function as a dielectric material having a dielectric constant (k) of about 1. The air gaps 134 may limit capacitance (e.g., parasitic capacitance, stray capacitance) and increase shorting margin between horizontally neighboring conductive structures 124, and may reduce cross-talk therebetween.

As shown in FIGS. 1G and 1H, individual contact structures 110 and individual interconnect structures 114, may be operatively associated with a single (e.g., one) of each of the liner structures 126 and the conductive structures 124. The contact structures 110 and the underlying pillar structures 104 (FIG. 1F) may be configured in rows extending in parallel in the X-direction and offset from one another in the Y-direction. Within an individual row, horizontally neighboring interconnect structures 114, contact structures 110, and pillar structures may be substantially equally spaced from one another in the X-direction. The interconnect structures 114, the contact structures 110, and the pillar structures 104 of an individual row may be offset (e.g., staggered) in the X-direction relative to the interconnect structures 114, the contact structures 110, and the pillar structures 104 (FIG. 1F) of a horizontally neighboring row. In some embodiments, the pillar structures 104 (FIG. 1F), and hence the contact structures 110, are provided a hexagonal close packed arrangement within the microelectronic device structure 100, and the horizontal positions of the interconnect structures 114 are selected to accommodate the hexagonal close packed arrangement and facilitate coupling the contact structures 110 and the pillar structures 104 (FIG. 1F) to the conductive structures 124 (e.g., digit lines) extending in parallel in the Y-direction.

Accordingly, a method of forming a microelectronic device includes forming conductive interconnect structures vertically extending through isolation material to conductive contact structures coupled to pillar structures, forming a metal silicide material on the interconnect structures and the first isolation material, forming a conductive material on the metal silicide material, and forming a dielectric material over the conductive material. The method further includes forming openings vertically extending through the dielectric material, the conductive material, the metal silicide material, and the isolation material and forming additional isolation material to extend over remaining portions of the dielectric material and at least partially fill the openings.

Figure 2A:
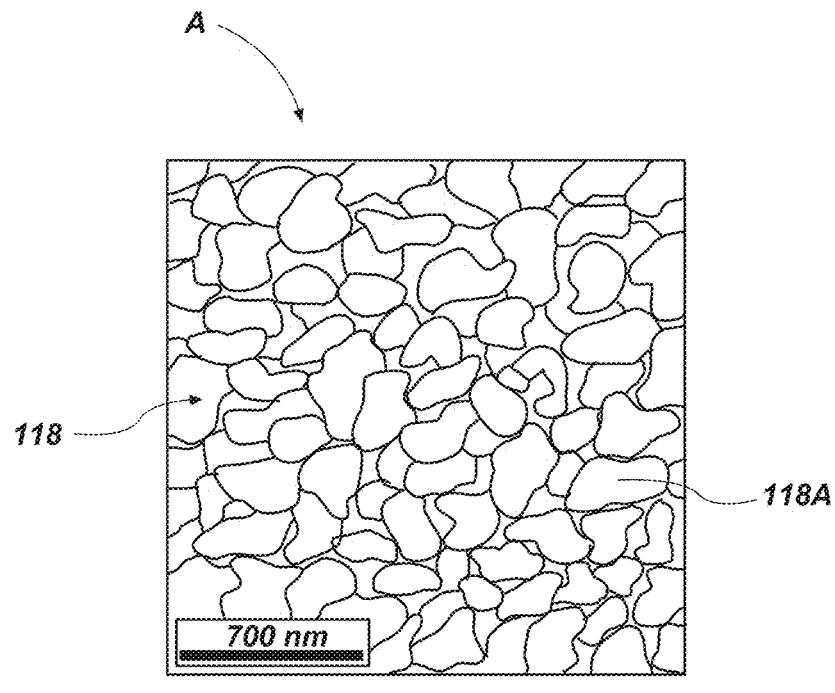
FIG. 2A is a diagram of a grain distribution of a conductive material formed over a metal silicide liner, in accordance with embodiments of the disclosure.

FIG. 2A shows a diagram of a grain distribution A of the conductive material 118 (FIG. 1D) formed over the liner material 116 (FIG. 1D) at the processing stage previously described with reference to FIG. 1D. The grain distribution A shown in FIG. 2A is also applicable to the conductive structures 124 (FIGS. 1E, 1F, and 1H) formed from the conductive material 118 (FIG. 1D) at the processing stage previously described with reference to FIG. 1E. As previously discussed herein, the metal silicide material of the liner material 116 (FIGS. 1C and 1D) forms a template for forming relatively larger grains of the conductive material 118 facilitating relatively lower resistivity and increased tensile stress for the conductive material 118 as compared to conductive material 118 formed without using the liner material 116 (FIGS. 1C and 1D) as a template. For the purpose of comparison, FIG. 2B shows a diagram of a grain distribution B of a conductive material 136 formed without the previous formation of the liner material 116 (FIGS. 1C and 1D).

Figure 2B:
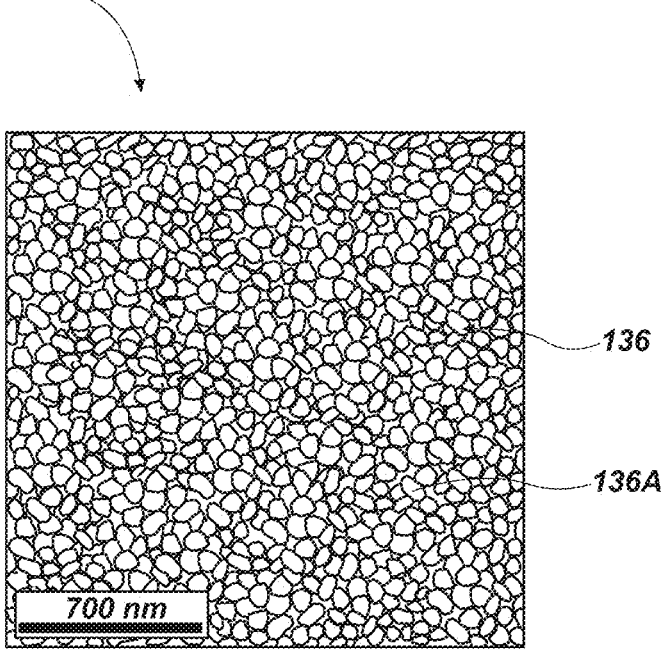
FIG. 2B is a diagram of a grain distribution of a conductive material formed in the absence of the metal silicide liner described with reference to FIG. 2A.

Referring to collectively FIGS. 2A and 2B, grains 118A of the conductive material 118 formed over the liner material 116 (FIG. 1D) are larger than grains 136A of the conductive material 136 formed without the underlying liner material 116. A mean grain size of the conductive material 118 may be within a range of from about 3 to about 10 times greater than a mean grain size of the conductive material 136. For example, the mean grain size of the conductive material 118 may be within a range of from about 3 to about 5 times greater than the mean grain size of the conductive material 136, such as from about 3 to about 7 times greater, from about 5 to about 7 times greater, from about 5 to about 10 times greater, or from about 7 to about 10 times greater than the mean grain size of the conductive material 136. In some embodiments, the mean grain size of the conductive material 118 is within a range of from about 5 times to about 7 times greater than the mean grain size of the conductive material 136.

The template provided by the grain sizes of the liner material 116 results in the conductive material 118 being formed at a low-resistivity phase. The increased grain size of the conductive material 118 results in a decreased resistivity of the conductive structures 124 (FIGS. 1E, 1F, and 1H) formed therefrom, increased current delivery by the conductive structures 124, and an increased tensile stress of the conductive structures 124 in comparison to conventional conductive lines (e.g., data lines, bit lines). Accordingly, performance of a microelectronic device (e.g., memory device) formed to include the microelectronic device structure 100 is improved during use and operation of the microelectronic device.

As discussed above, the conductive material 118 (FIG. 2A) has an increased tensile stress as compared to conductive material 136 (FIG. 2B). The increased tensile stress of the conductive material 118 compensates for compressive stress of the dielectric material 120 (FIG. 1F). During the formation of the openings 122 (FIG. 1E), the increased tensile stress of the conductive material 118 improves a shorting margin between adjacent conductive structures 124 by limiting undesirable lateral movement (e.g., lateral "wobble") of the conductive structures 124 that may otherwise result in horizontally neighboring conductive structures 124 coming into physical contact with one another. The increased tensile stress of the conductive material 118 and the improved shorting margin may facilitate forming the openings 122 (FIG. 1E) and any fill materials within the openings 122 (FIG. 1E) (e.g., the air gaps 134, the second isolation material 132) at a decreased width as compared to conventional openings and materials disposed between conventional horizontally neighboring conductive lines. For example, referring collectively to FIGS. 1E and 1F, the horizontal widths in the X-direction of the openings 122 (FIG. 1E) and the fill materials within the openings 122 (FIG. 1E) (e.g., the air gaps 134 (FIG. 1F), the second isolation material 132 (FIG. 1F)) may be within a range of from about 10% to about 30% less than a horizontal width in the X-direction of conventional openings and fill materials.

Accordingly, a microelectronic device includes pillar structures including semiconductor material, insulative material overlying the pillar structures, and conductive interconnect structures extending through the isolation material and in electrical communication with the pillar structures. The microelectronic device further includes metal silicide structures on the insulative material and the conductive interconnect structures, conductive line structures on the metal silicide liners, dielectric structures over the conductive line structures, and additional insulative material over the dielectric structures and horizontally extending across and between the dielectric structures.

Furthermore, a memory device includes a stack structure including tiers. The tiers each include conductive material vertically adjacent insulative material. The memory device further includes isolation material overlying the stack structure and pillar structures comprising semiconductor material. The pillar structures vertically extend through the stack structure and into the isolation material, intersections of the pillar structures and the conductive material of the tiers of the stack structure forming vertically extending strings of memory cells. The memory device includes conductive interconnect structures within the isolation material and vertically overlying and in electrical communication with the pillar structures, metal silicide structures on the isolation material and the conductive interconnect structures, and digit line structures on the metal silicide structures and individually having a mean grain size greater than or equal to about 200 nm.

FIG. 3 illustrates a partial cutaway perspective view of a portion of a microelectronic device 300 (e.g., a memory device, such as a 3D NAND Flash memory device including microelectronic device structure 302). The microelectronic device structure 302 may be substantially similar to the microelectronic device structure 100 at the processing stage previously described with reference to FIGS. 1F, 1G, and 1H. For clarity and ease of understanding the drawings and associated description, some features (e.g., structures, materials, regions, devices) of the microelectronic device structure 100 at the processing stage previously described with reference to FIGS. 1F, 1G, and 1H are not shown in FIG. 3. However, it will be understood that any features of the microelectronic device structure 100 previously described with reference to FIGS. 1F, 1G, and 1H may be included in the microelectronic device structure 302 of the microelectronic device 300 described herein with reference to FIG. 3.

As shown in FIG. 3, in addition to the features of the microelectronic device structure 100 previously described herein in relation to the microelectronic device structure 100 (FIGS. 1F, 1G, and 1H), the microelectronic device 300 includes stack structure 301 including a vertically alternating sequence of insulative structures 307 and conductive structures 308 arranged in tiers 309. The stack structure 301 may vertically underlie the first isolation material 102 previously described herein with reference to FIGS. 1A through 1F. The stack structure 301 may be divided into blocks 325 separated from one another by dielectric-filled slots 326. In addition, the microelectronic device 300 may include staircase structures 304 within staircase regions of the blocks 325 of the stack structure 301. The staircase structures 304 of the blocks 325 may individually include steps 327 defined by horizontal ends (e.g., edges) of the tiers 309 of the stack structure 301. The steps 327 have treads (e.g., upper surfaces) defining contact regions for the conductive structures 308 of the tiers 309 of the stack structure 301.

The microelectronic device 300 may further include access line routing structures 306, one or more source structures 316, first select gates 324 (e.g., upper select gates, drain select gates (SGDs)), select line routing structures 320, one or more second select gates 322 (e.g., lower select gates, source select gate (SGSs)), additional contact structures 328 (e.g., access line contact structures, select line contact structures), and digit line structures 314. The digit line structures 314 may correspond to the conductive structures 124 previously described with reference to FIGS. 1E and 1F, and may vertically overlie and be coupled to the pillar structures 310 corresponding to the pillar structures 104 previously described with reference to FIGS. 1A through 1F. Intersections of the pillar structures 310 and the conductive structures 308 of the tiers 309 of the stack structure 301 form strings of memory cells 312 vertically extending through the stack structure 301. In addition, the additional contact structures 328 may couple various features of the microelectronic device 300 to one another as shown (e.g., the select line routing structures 320 to the first select gates 324; the access line routing structures 306 to the conductive structures 308 of the tiers 309 of the stack structure 301).

The microelectronic device 300 may also include a base structure 330 positioned vertically below the pillar structures 310 (and, hence, the strings of memory cells 312). The base structure 330 may include at least one control logic region including control logic devices configured to control various operations of other features (e.g., the strings of memory cells 312) of the microelectronic device 300. As a non-limiting example, the control logic region of the base structure 330 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 330 may be coupled to the source structure 316, the access line routing structures 306, the select line routing structures 320, and the digit line structures 314. In some embodiments, the control logic region of the base structure 330 includes CMOS (complementary metal-oxide-semiconductor) circuitry. In such embodiments, the control logic region of the base structure 330 may be characterized as having a "CMOS under Array" ("CuA") configuration.

Figure 4:
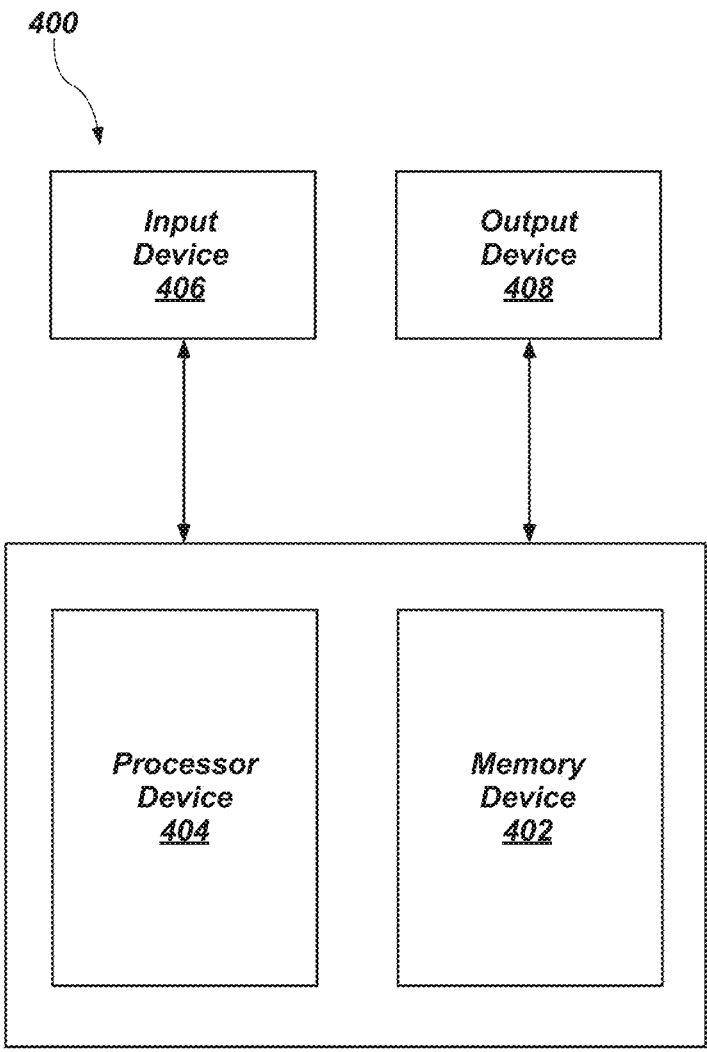
FIG. 4 is a block diagram of an electronic system, in accordance with embodiments of the disclosure.

Microelectronic devices structures (e.g., the microelectronic device structure 100 previously described with reference to FIGS. 1F through 1H) and microelectronic devices (e.g., the microelectronic device 300 (FIG. 3)) in accordance with embodiments of the disclosure may be used in embodiments of electronic systems of the disclosure. For example, FIG. 4 is a block diagram of an electronic system 400, in accordance with embodiments of the disclosure. The electronic system 400 may include, for example, a computer or computer hardware component, a server or other networking hardware component, a cellular telephone, a digital camera, a personal digital assistant (PDA), a portable media (e.g., music) player, a Wi-Fi or cellular-enabled tablet such as, for example, an iPAD® or SURFACE® tablet, an electronic book, a navigation device. The electronic system 400 includes at least one memory device 402. The at least one memory device 402 may include, for example, one or more of a microelectronic device structure (e.g., the microelectronic device structure 100 previously described with reference to FIGS. 1F through 1H) and a microelectronic device (e.g., the microelectronic device 300 (FIG. 3)) previously described herein.

The electronic system 400 may further include at least one electrical signal processor device 404 (e.g., a microprocessor). The electrical signal processor device 404 may, optionally, include one or more of a microelectronic device structure (e.g., the microelectronic device structure 100 previously described with reference to FIGS. 1F through 1H) and a microelectronic device (e.g., the microelectronic device 300 (FIG. 3)) previously described herein. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure (e.g., the microelectronic device structure 100 previously described with reference to FIGS. 1F through 1H) and a microelectronic devices (e.g., the microelectronic device 300 (FIG. 3)) previously described herein.

The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, and a speaker. In some embodiments, the input device 406 and the output device 408 may include a single device that can be used to both input information to the electronic system 400 and to output information to a user. For example, the input device 406 and the output device 408 may include a single touchscreen device that can input information from a user to the electronic system 400 and output visual information to a user. The input device 406 and the output device 408 may communicate electrically with one or more of the memory device 402 and the electronic signal processor devices 404.

Figure 5:
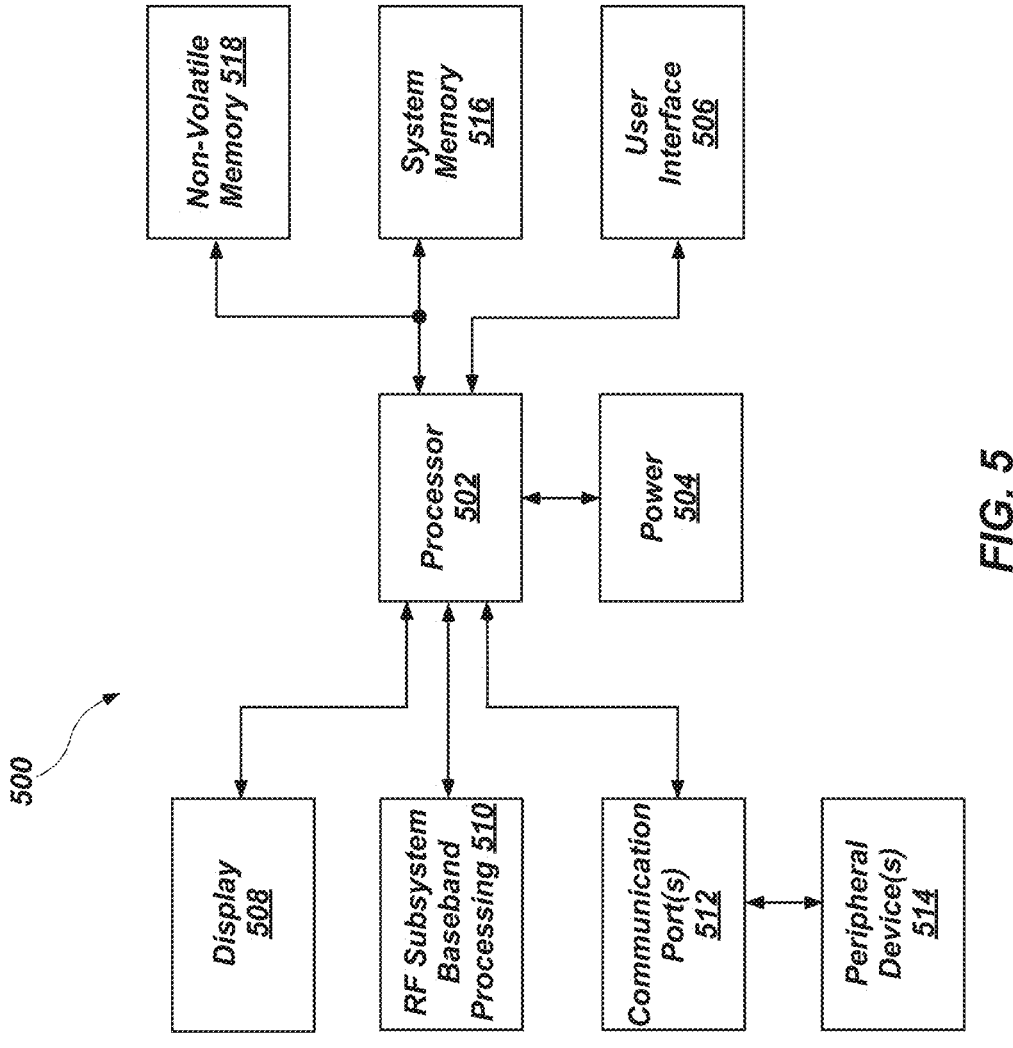
FIG. 5 is a block diagram of a processor-based system, in accordance with embodiments of the disclosure.

FIG. 5 is a block diagram of a processor-based system 500, in accordance with embodiments of the disclosure. The processor-based system 500 may include an embodiment of one or more of a microelectronic device structure (e.g., the microelectronic device structure 100 previously described with reference to FIGS. 1F through 1H) and a microelectronic device (e.g., the microelectronic device 300 (FIG. 3)) previously described herein. The processor-based system 500 may be any of a variety of types, such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and/or other subcomponents of the processor-based system 500 may include one or more of a microelectronic device structure (e.g., the microelectronic device structure 100 previously described with reference to FIGS. 1F through 1H) and a microelectronic device (e.g., the microelectronic device 300 (FIG. 3)) previously described herein.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, and LED display, a three-dimensional projection, an audio display, or a combination thereof.

Furthermore, an RF sub-system/baseband processor 510 may also be coupled to the processor 502. The RF sub-system/baseband processor 510 may include an antenna that is coupled to an RF receiver and to an RF transmitter (not shown). One or more communication ports 512 may also be coupled to the processor 502. The communication ports 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 includes one or more of a microelectronic device structure (e.g., the microelectronic device structure 100 previously described with reference to FIGS. 1F through 1H) and a microelectronic device (e.g., the microelectronic device 300 (FIG. 3)) previously described herein.

The processor 502 may also be coupled to non-volatile memory 518. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as a disk drive memory, such as a hybrid-drive including resistive memory or other types of non-volatile solid-state memory, for example. The non-volatile memory 518 may include one or more of a microelectronic device structure (e.g., the microelectronic device structure 100 previously described with reference to FIGS. 1F through 1H) and a microelectronic device (e.g., the microelectronic device 300 (FIG. 3)) previously described herein.

Accordingly, an electronic system includes a processor operably coupled to an input device and an output device and a memory device operably coupled to the processor and including at least one microelectronic device structure. The at least one microelectronic device structure includes strings of memory cells vertically extending through a stack structure including a vertically alternating sequence of insulative material and conductive material, metal silicide line structures vertically overlying and in electrical communication with the strings of memory cells, and conductive line structures vertically on the metal silicide line structures. Grains of the conductive line structures individually have a grain size within a range of from about 250 nm to about 650 nm.

The structures, devices, and systems of the disclosure advantageously facilitate one or more of greater packaging density, increased structure yield, and increased miniaturization of components as compared to conventional structures, conventional devices, and conventional systems. The methods of the disclosure facilitate the formation of devices (e.g., apparatuses, microelectronic devices, memory devices) and systems (e.g., electronic systems) having one or more of improved performance, reliability, and durability, increased yield, increased miniaturization of components, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a microelectronic device, the method comprising:

forming conductive interconnect structures vertically extending through insulative material to conductive contact structures coupled to pillar structures comprising semiconductive material;

forming a metal silicide material on the conductive interconnect structures and the insulative material;

forming a conductive material on the metal silicide material;

forming a dielectric material over the conductive material;

forming openings vertically extending through the dielectric material, the conductive material, and the metal silicide material and into the insulative material to form dielectric structures from the dielectric material, conductive line structures from the conductive material, and metal silicide structures from the metal silicide material; and forming additional insulative material to extend over the dielectric structures and partially fill the openings to form air gaps underlying the additional insulative material, each of the air gaps vertically overlapping and horizontally interposed between each of a horizontally neighboring pair of the dielectric structures, a horizontally neighboring pair of the conductive line structures, and a horizontally neighboring pair of the metal silicide structures.

2. The method of claim 1, further comprising:

forming the metal silicide material to comprise tungsten silicide; and forming the conductive material to comprise tungsten.

3. The method of claim 1, wherein forming a conductive material on the metal silicide material comprises forming the conductive material to exhibit a tensile stress greater than about 1000 MPa.

4. The method of claim 1, wherein forming a conductive material on the metal silicide material comprises forming the conductive material to have a mean grain size within a range of from about 100 nm to about 800 nm.

5. The method of claim 1, wherein forming a metal silicide material comprises forming the metal silicide material to have a vertical thickness within a range of from about 10 Å to about 25 Å.

6. The method of claim 1, wherein forming a metal silicide material comprises forming the metal silicide material to be substantially amorphous.

7. A microelectronic device, comprising:

pillar structures comprising semiconductor material;

insulative material overlying the pillar structures;

conductive interconnect structures extending through isolation material and in electrical communication with the pillar structures;

metal silicide structures on the insulative material and the conductive interconnect structures;

conductive line structures on the metal silicide structures;

dielectric structures over the conductive line structures;

additional insulative material over the dielectric structures and horizontally extending across and between the dielectric structures; and air gaps underlying the additional insulative material, each of the air gaps vertically overlapping and horizontally interposed between each of a horizontally neighboring pair of the dielectric structures, a horizontally neighboring pair of the conductive line structures, and a horizontally neighboring pair of the metal silicide structures.

8. The microelectronic device of claim 7, wherein:

the metal silicide structures comprise tungsten silicide; and the conductive line structures comprise tungsten.

9. The microelectronic device of claim 7, wherein the metal silicide structures comprise one or more of tungsten silicide, tantalum silicide, titanium silicide, nickel silicide, and copper silicide.

10. The microelectronic device of claim 7, wherein the metal silicide structures are substantially homogeneous.

11. The microelectronic device of claim 7, wherein the conductive line structures individually have a mean grain size within a range of from about 100 nm to about 800 nm.

12. A microelectronic device, comprising:

pillar structures comprising semiconductor material;

insulative material overlying the pillar structures;

conductive interconnect structures extending through isolation material and in electrical communication with the pillar structures;

metal silicide structures on the insulative material and the conductive interconnect structures;

conductive line structures on the metal silicide structures;

dielectric structures over the conductive line structures;

additional insulative material over the dielectric structures and horizontally extending across and between the dielectric structures;

a stack structure underlying the insulative material and comprising tiers each comprising a conductive structure and an insulative structure vertically neighboring the conductive structure, the pillar structures vertically extending through the stack structure and into the insulative material; and conductive plug structures within the insulative material, the conductive plug structures vertically interposed between and in electrical communication with the pillar structures and the interconnect structures.

13. A memory device, comprising:

a stack structure including tiers each comprising conductive material vertically adjacent insulative material;

isolation material vertically overlying the stack structure;

pillar structures comprising semiconductor material vertically extending through the stack structure and into the isolation material, intersections of the pillar structures and the conductive material of the tiers of the stack structure forming vertically extending strings of memory cells;

conductive interconnect structures within the isolation material and vertically overlying and in electrical communication with the pillar structures;

metal silicide structures on the isolation material and the conductive interconnect structures;

digit line structures on the metal silicide structures and individually having a mean grain size greater than or equal to about 100 nm; and dielectric line structures on the digit line structures;

additional isolation material vertically on and horizontally extending across and between the dielectric line structures; and air gaps vertically underlying the additional isolation material and individually horizontally interposed between each of two of the dielectric line structures horizontally neighboring one another, two of the digit line structures horizontally neighboring one another, and two of the metal silicide structures horizontally neighboring one another.

14. The memory device of claim 13, wherein the mean grain size of the digit line structures is within a range of from about 100 nm to about 800 nm.

15. The memory device of claim 13, wherein lower vertical boundaries of the air gaps are positioned between upper vertical boundaries and lower vertical boundaries of the conductive interconnect structures.

* * * * *